United States Patent [19]

Spinella et al.

[11] Patent Number: 5,644,154
[45] Date of Patent: Jul. 1, 1997

[54] MOS READ-ONLY SEMICONDUCTOR MEMORY WITH SELECTED SOURCE/DRAIN REGIONS SPACED AWAY FROM EDGES OF OVERLYING GATE ELECTRODE REGIONS AND METHOD THEREFOR

[75] Inventors: Salvatore Spinella; Gianpaolo Spadini, both of Mesa, Ariz.

[73] Assignee: Microchip Technology Incorporated, Chandler, Ariz.

[21] Appl. No.: 410,966

[22] Filed: Mar. 27, 1995

[51] Int. Cl.6 .......................... H01L 29/76; H01L 29/94; H01L 31/062; H01L 31/113
[52] U.S. Cl. .......................... 257/390; 257/391; 257/392; 365/104
[58] Field of Search .......................... 257/391, 390, 257/392; 365/104

[56] References Cited

U.S. PATENT DOCUMENTS

| | | | |
|---|---|---|---|
| 4,365,263 | 12/1982 | Kawagoe | 257/391 |
| 4,380,866 | 4/1983 | Countryman, Jr. et al. | 29/577 |
| 4,384,345 | 5/1983 | Mikome | 365/104 |
| 4,406,049 | 9/1983 | Tam et al. | 29/571 |
| 4,837,181 | 6/1989 | Galbiati et al. | 437/45 |
| 4,847,808 | 7/1989 | Kobatake | 365/104 |
| 5,291,435 | 3/1994 | Yu | 365/104 |
| 5,313,418 | 5/1994 | Wada et al. | 365/104 |
| 5,517,061 | 5/1996 | Azmanov | 257/758 |

*Primary Examiner*—Ngân V. Ngô
*Attorney, Agent, or Firm*—Harry M. Weiss; Jeffrey D. Moy; Harry M. Weiss & Associates, P.C.

[57] ABSTRACT

Method and structure is disclosed for a read-only MOS semiconductor memory. An addressable array of a multiplicity of cells each comprising a single MOS transistor is coded for preselected cells by providing them with source/drain regions which are spaced apart from edges of their respective overlying gate electrode regions. This is accomplished by a masking step late in the fabrication sequence. In this way, a dense MOS memory having rapid manufacturing turn-around is provided.

14 Claims, 4 Drawing Sheets

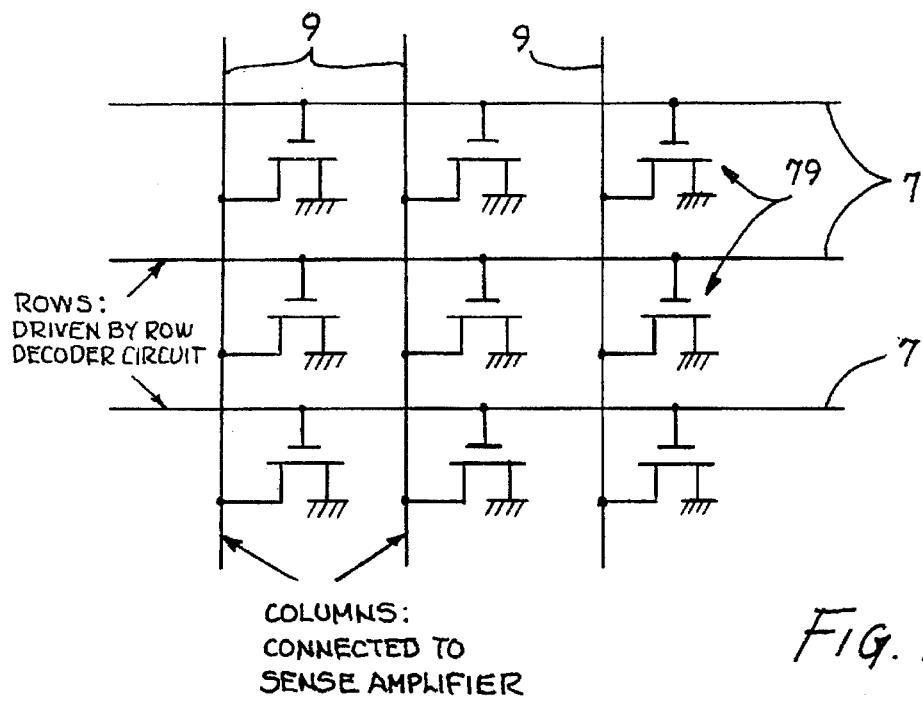
Fig. 1
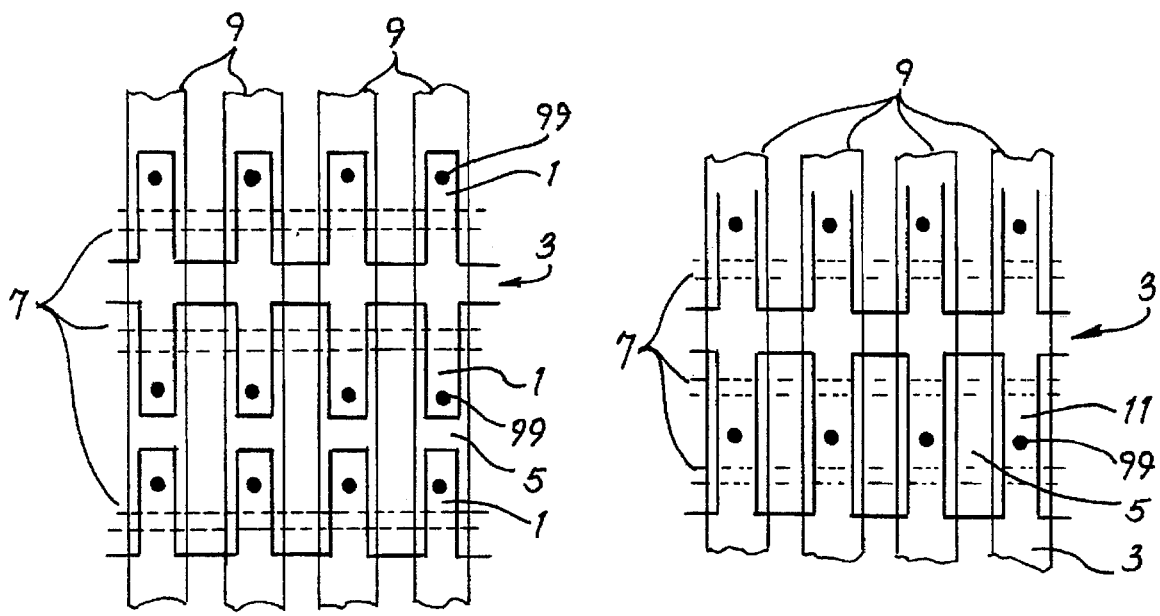
Fig. 2
(PRIOR ART)
Fig. 3

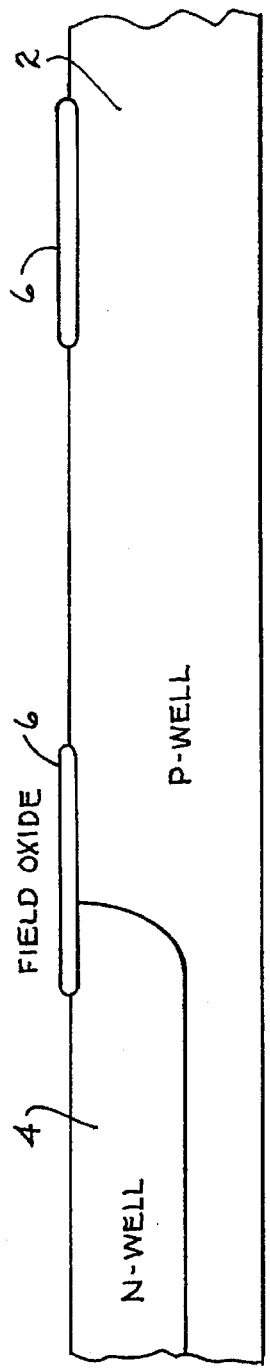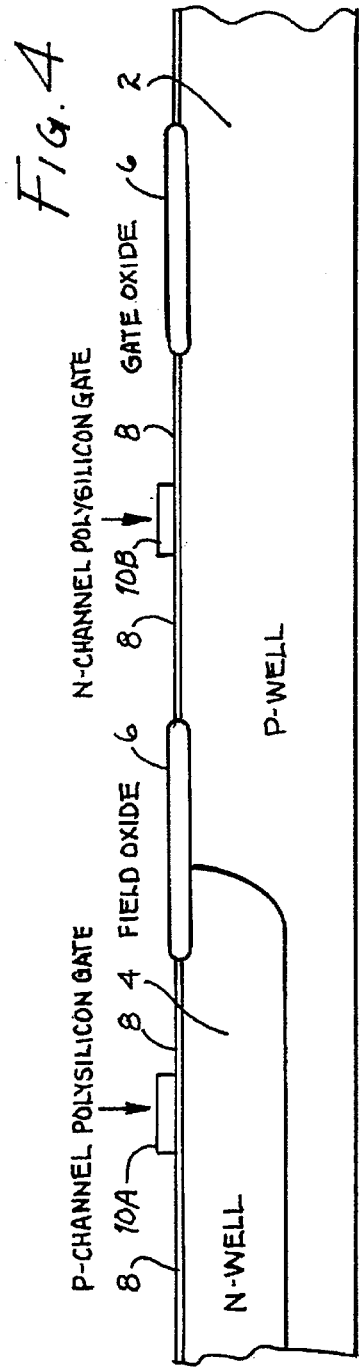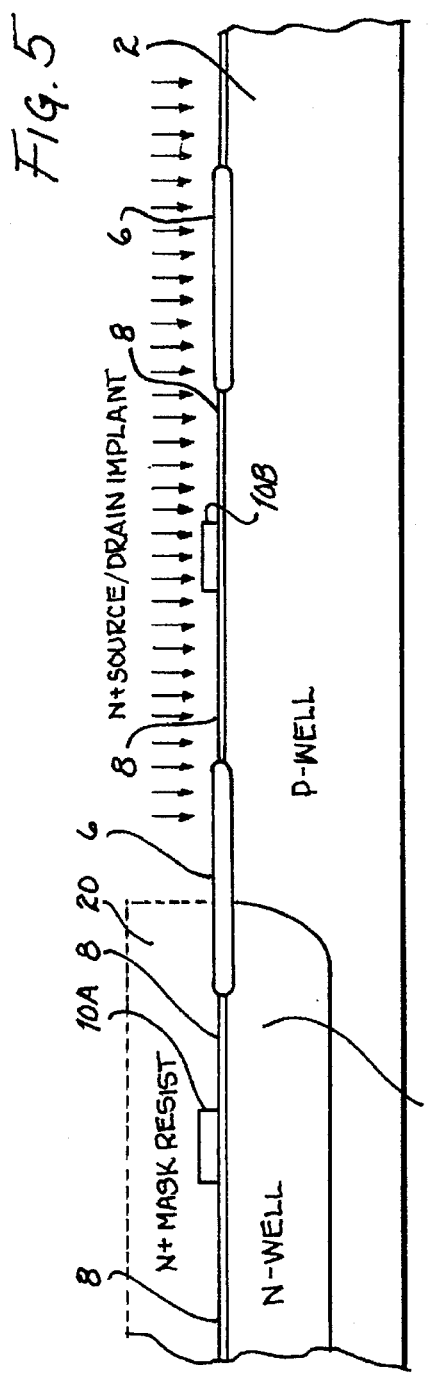

MOS READ-ONLY SEMICONDUCTOR MEMORY WITH SELECTED SOURCE/ DRAIN REGIONS SPACED AWAY FROM EDGES OF OVERLYING GATE ELECTRODE REGIONS AND METHOD THEREFOR

FIELD OF THE INVENTION

This invention relates generally to semiconductor devices, semiconductor memory devices and memory arrays, and methods therefor, and, more particularly, relates to a MOS (metal-oxide-semiconductor) ROM (read-only memory) array which is mask-programmable at a point late in the fabrication sequence, and method therefor.

BACKGROUND OF THE PRIOR ART

In the past, various types of semiconductor devices for use as semiconductor memory devices were created to provide a semiconductor memory array or system which would incorporate these semiconductor memory devices. In the fabrication of semiconductor memory devices in order to produce a high density semiconductor memory array, it is important and critical to produce or provide each semiconductor memory device to be reliable, small, relatively easy to manufacture, and, of course, cost effective.

In the fabrication of ROM (read-only memory) type semiconductor memory arrays or systems, the technology has developed to the point where there are many different types of ROM type semiconductor memory arrays or systems. For example, a common type of a ROM type semiconductor memory array has a bit pattern formed by the use of one or more predetermined mask steps in the fabrication process.

In a semiconductor memory array comprising gate-addressable MOS semiconductor transistors, preselected enhancement semiconductor transistor devices are rendered permanently non-conductive by a combination of one or more mask and process steps in order to suppress the channel conduction of certain of the MOS semiconductor devices selected in accordance with a predetermined bit pattern. For example, MOS drain contact windows may be omitted at preselected semiconductor devices in order to keep these devices from conducting.

However, a denser array may usually be achieved by the use of merged or common drains for two or more MOS semiconductor devices. In this case omission of the drain contact suppresses channel conduction in all of the common-drain devices which is not likely to be in accordance with a desired pre-determined bit pattern. Since the customer demand for any particular bit pattern changes with the application, it is desirable to be able to modify the bit pattern as late as possible in the semiconductor fabrication sequence in order to be able to provide quick turn-around response to customer needs and schedules. Additionally, by being able to customize the desired bit pattern as late as possible in the semiconductor fabrication process, this permits a manufacturer to process a large amount of semiconductor wafers up to the step in the process where the customization of the bit pattern is carried out. This enables the manufacturer to be able to place into inventory almost completed semiconductor wafers ready for rapid customization and completion.

Accordingly, there has been a need to provide a high-density MOS ROM array which may be mask-programmed late in the semiconductor fabrication process sequence in order to facilitate cost-effective fast-response manufacturing.

SUMMARY OF THE INVENTION

It is an object of this invention to provide an improved semiconductor memory device and method.

It is a further object of this invention to provide an improved MOS read-only memory array and method.

It is another object of this invention to provide an improved configuration for a high-density mask-programmable MOS ROM and method.

It is yet a further object of this invention to provide a method for fabricating a mask-programmable MOS ROM wherein the programming step to establish the desired or customized bit pattern occurs at a late point or process step in the fabrication sequence.

It is still another object of this invention to provide a structure and process for a high-density MOS ROM which is compatible with a conventional MOS semiconductor fabrication sequence.

BRIEF DESCRIPTION OF THE PREFERRED EMBODIMENTS

In accordance with one preferred embodiment of this invention, a semiconductor memory device is provided which comprises a semiconductor region having a doped substrate portion of one conductivity type and a dielectric layer on a surface thereof. Word lines preferably comprising stripes of doped polysilicon lie on the dielectric layer and comprise gates for enabling conduction between doped source/drain regions of a second conductivity type located in the doped substrate portion. These doped regions or portions extend completely up to the overlying gates when conduction is desired, and do not reach the overlying gates when conduction is not desired. Preferably metal bit lines overlying but insulated from the (word) gate lines connect to drain regions for sensing conduction.

In accordance with another preferred embodiment of this invention, regularly spaced doped polysilicon gate strips comprising word lines overlie the gate dielectric layer. Doped regions of second conductivity type (as compared to the substrate (containing said doped regions) that is of a first conductivity type) are connected to preferably metallic bit lines which are each common drain regions for at least two sources. Source regions lying between the polysilicon gate lines having one of three predetermined widths enable formation of a desired bit pattern. The source/drain regions are patterned and formed at a point late in the fabrication sequence of the semiconductor memory chip so that a high-density memory array may be efficiently manufactured.

In accordance with a further embodiment of this invention, where a source region does not extend beneath an overlying gate electrode region, the underlying space between the source region and the overlying gate electrode is doped with a species having a conductivity opposite that of the source to ensure that there is no undesired conduction (i.e. along a surface inversion portion). Again, this doping step occurs late in the fabrication sequence for the semiconductor memory array.

In accordance with a preferred process according to this invention, a custom mask layer according to a predetermined customized bit pattern is used to provide source/drain regions which are not (beneath or) in alignment with overlying gate electrode regions as they would be in a standard CMOS processed structure. Common drain regions are all connected to preferably metallized bit lines in order to provide a high-density array.

The foregoing and other objects, features, and advantages of this invention will be apparent from the following more particular description of the preferred embodiments of the invention as illustrated in the accompanying drawings.

BRIEF DESCRIPTION OF THE FIGURES

FIG. 1 is a skeleton schematic diagram of the type of MOS ROM type memory array suitable for use with the present invention.

FIG. 2 is a top view of the layout of a portion of a semiconductor memory array according to the prior art.

FIG. 3 is a layout of a portion of a substantially denser semiconductor memory array of the type contemplated by the present invention.

FIGS. 4-8 illustrate the major process steps of a CMOS fabrication sequence suitable for use in the present invention.

DETAILED DESCRIPTION

Figure 7:
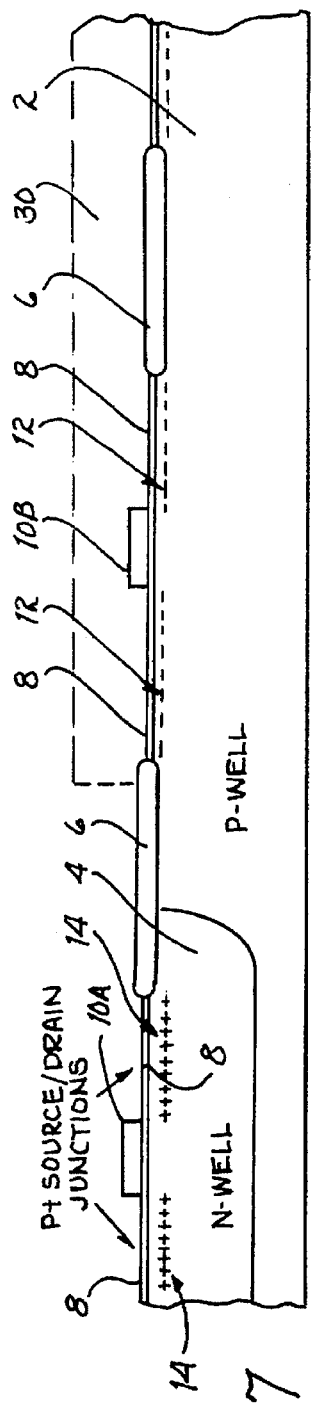

Referring now to FIG. 1, a schematic diagram of the general type of MOS (ROM type) memory array suitable for use with the present invention is shown. A plurality of MOS semiconductor transistors 79 of a single conductivity type (i.e. either N-channel or P-channel) form a semiconductor array with gates connected to a plurality of row conductors 7 and drains connected to column conductors 9. Each of the MOS semiconductor transistors 79 is read by applying a voltage above threshold to each of the rows and sensing the current flowing in each of the columns with a sense amplifier (not shown). In accordance with a predetermined bit pattern, current flow in certain of the MOS semiconductor transistors 79 is substantially suppressed or prevented while in others current flows in response to the above-threshold voltage applied to the rows. The process, subsequently described, permits (late in the semiconductor process) selection of which MOS semiconductor transistors 79 are to be conductive (a "1" or "0") as desired.

Referring now to FIG. 2, a top view portion is shown of a typical ROM type semiconductor memory array according to the prior art. Here the row conductors 7 are regularly-spaced lines (shown by dotted lines) of doped polycrystalline silicon which also serve to provide the gates of the MOS semiconductor devices (see FIG. 1) in the array. In the case of N-channel MOS semiconductor devices, region 3 is an N+ region which is a common source for a pair of N+ drain regions 1. The source/drain N+ regions and the gate regions are covered by an insulator (not shown) through which contact holes 99 are formed to allow electrical contact between overlying metal bit (column) lines 9 and the N+ drains 1. This semiconductor memory array is very simple to implement and for example, a "0" (or "1") is programmed simply by not defining a contact hole for any MOS semiconductor transistor which is to be rendered permanently nonconductive. A region of thick field oxide 5 serves to provide electrical isolation between N+ drain regions 1 in both the row and column directions.

To increase the semiconductor memory array density by decreasing the semiconductor memory cell size, the drain contact 99 must be shared between semiconductor memory cells. An example of a semiconductor memory array sharing the drain contact 99 between two adjacent semiconductor memory cells in a column is shown in FIG. 3. Here a common N+ drain region 11 lies between adjacent columnar source regions 3. Such an arrangement may be 30 to 40% smaller than the semiconductor memory array of FIG. 2, but cannot be programmed at the ohmic contact level by omitting contact holes. Instead, a "0" (or "1") may be programmed or created by forming the thick oxide under the doped polysilicon gate electrode in the locations where conductivity is to be suppressed, or alternatively by raising the threshold voltage of the MOS semiconductor 79 transistor above the operating voltage by a separate doping step prior to formation of the doped polycrystalline gate stripes 7. In both cases the programming must be done very early in the process sequence so that the manufacturing cycle time measured from the coding step is substantially increased as compared with the less-dense array of FIG. 2.

In order to illustrate this point further, as well as to show how the present invention improves the cycle-time versus density tradeoff, a manufacturing sequence will now be described in accordance with this invention. FIGS. 4-8 illustrate the major process steps in a CMOS manufacturing flow. Referring now to FIG. 4, an N-well 4 is formed in a semiconductor substrate portion 2 providing an opposite conductivity P-well or substrate. Thick field oxide regions 6 are formed on a surface portion by patterning a deposited silicon nitride layer (not shown) and growing thick oxide in areas not protected by the nitride layer. At this step, the array may be coded by forming thick oxide in semiconductor memory cells where conduction is to be suppressed. The silicon nitride layer is then removed and the respective wells may be further doped by implantation to set the desired threshold voltages. Alternative coding may be effectuated using a separate mask step to allow selective implantation in predetermined cells for raising their threshold voltages above the contemplated operating voltage level for the entire semiconductor memory array. Relatively thin gate oxide layers 8 are then grown on the semiconductor (exposed) surface and polycrystalline silicon is deposited and patterned to form gate regions 10A and 10B, as all shown in FIG. 5.

Figure 8:
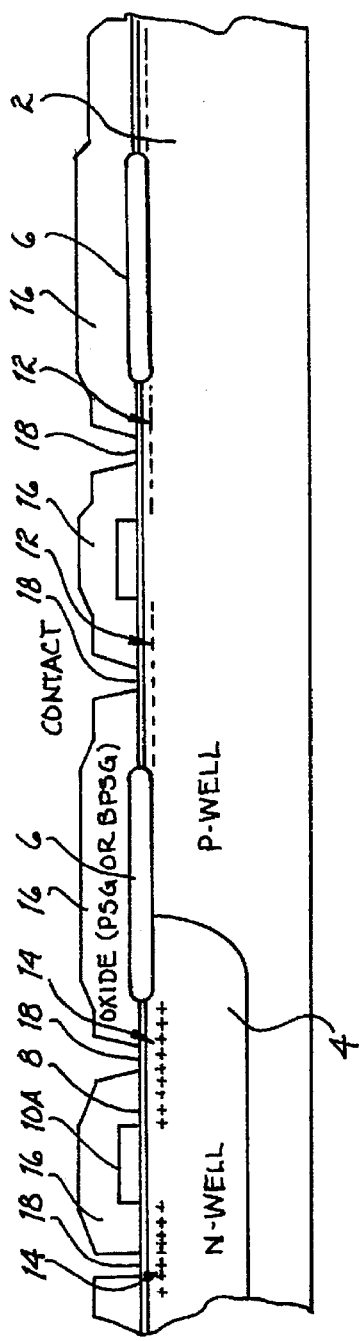

Referring now to FIG. 6, the process is continued by forming a patterned masking region 20 of photoresist and implanting an N-type species (N+) into portions of the P-well 2 not covered with thick oxide 6 or gate polycrystalline region 10B. As shown in FIG. 7, a patterned photoresist layer 30 is formed and a P-type species (P+) is introduced by ion implantation into those portions of the N-well 4 not covered by gate 10A or thick oxide 6. Annealing after the ion implantation steps results in the formation of P+ source/drain regions 14 in the N-well 4 and the N+ source/drain regions 12 in the P-well 2 (formed during the process described with relation to FIG. 6). The ion implantation operations of FIGS. 6 and 7 also form doped polysilicon gate electrodes 10A and 10B. A suitable doped oxide is then deposited over the entire top surface, flowed to planarize the structure, and, as shown in FIG. 8, contact holes 18 are cut through the doped oxide 16 in order to allow contact to the desired P+ source/drain regions 14 and the desired N+ source/drain regions 12.

Figure 9:
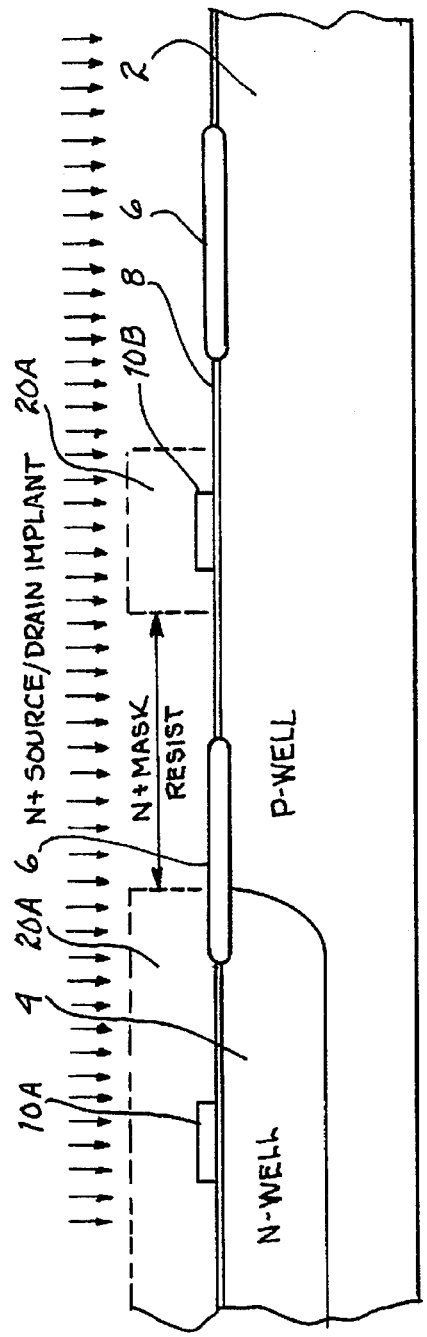
FIGS. 9-11 indicate how the process sequence of FIGS. 4-8 may be modified in order to produce semiconductor memory devices in accordance with the present invention.
Figure 10:
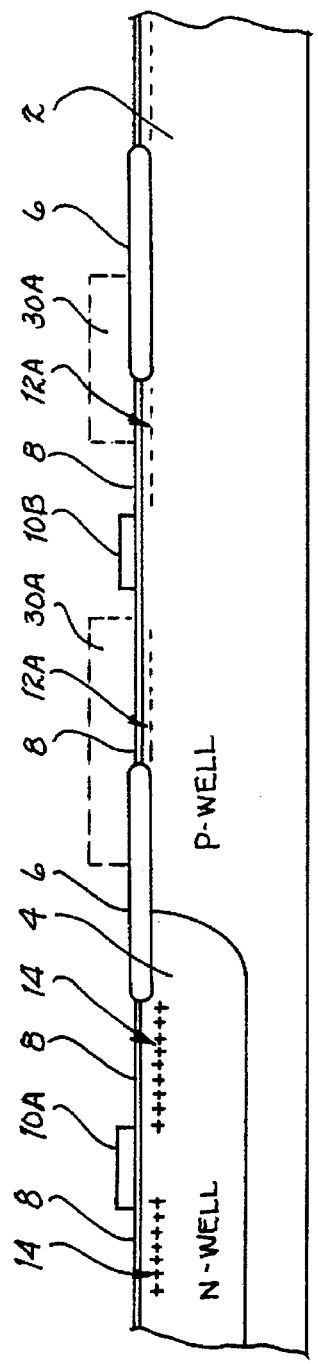
Figure 11:
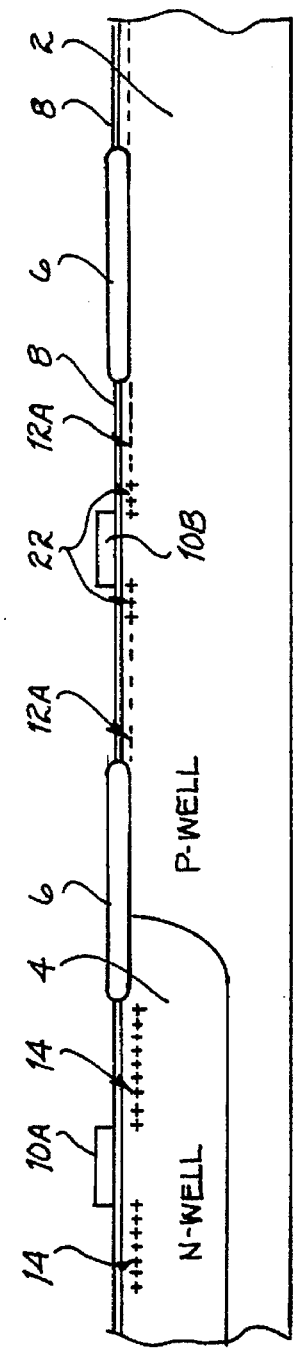

FIGS. 9-11 show how the foregoing MOS memory fabrication sequence may be modified in order to code the memory late in the process. Referring now to FIG. 9, regions 20A form a photoresist mask during the N+ source/drain implantation step. Here the region 20A, like the region 20 in FIG. 6, mask the N-well portion 4 of the substrate, while another masking region 20A masks the area on one or both sides of the gate region 10B. After the implant of the P+ source/drain regions and anneal operation, the structure appears as is shown in FIG. 10. One or both N+ source/drain regions 12A are laterally spaced away or apart from the overlying gate region 10B for an MOS transistor programmed with, for example, a "0" (or if desired a "1"). Since one or both source/drain junction(s) do(es) not overlap the overlying gate electrode 10B, the thus programmed MOS semiconductor transistor does not carry current and the relevant sense-amplifier (connected to a bit line connected to this programmed MOS semiconductor transistor) will not sense current from that MOS semiconductor transistor.

If the doping of the P-well 2 is low it will also be desirable to implant the P-type source/drain species (P+) into the lateral space(s) between the N-type (N+) source/drain regions 12A and the semiconductor surface regions before the overlying edges of the gate electrode 10B. This may be done simultaneously with the implantation of the P+ source/drain regions 14 (see FIG. 7). After this P+ ion implantation step, (as shown in FIG. 11), P+ source/drain regions surround overlying gate region or electrode 10A and P+ enhanced regions 22 surround overlying gate region or electrode 10B to ensure suppression of MOS conduction when such a location is programmed with a "0" (or, if desired a "1".

Figure 12:
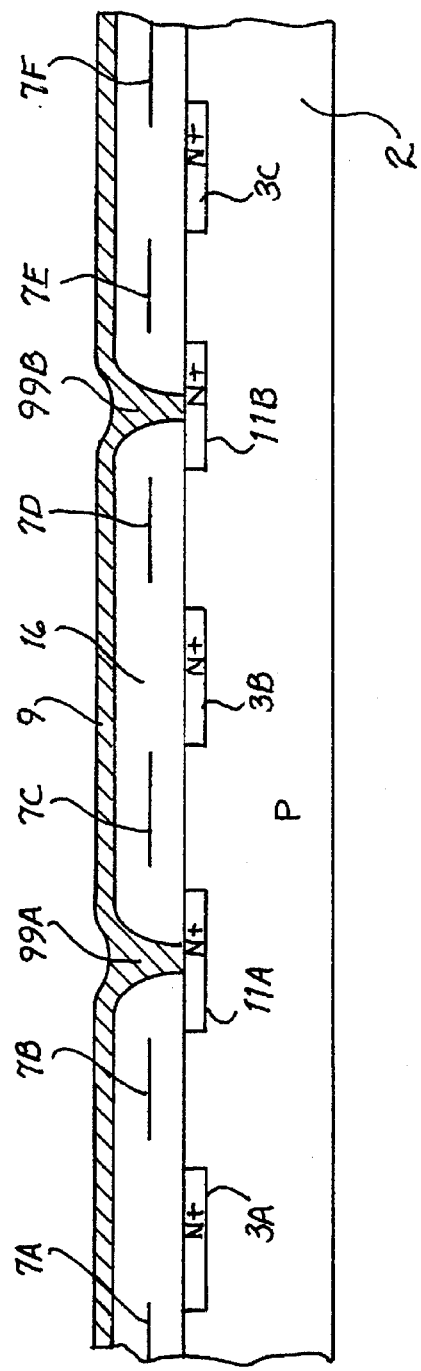
FIG. 12 shows a detailed cross-section of a portion of a MOS semiconductor memory array designed and fabricated in accordance with the present invention.

Referring now to FIG. 12, a more detailed example of the structure of a portion of an MOS semiconductor memory array according to the present invention is illustrated. In this view, only the N-type MOS transistors resulting from the CMOS fabrication sequence are shown, and the reference numerals are generally correlative to those in FIGS. 1–3 as an aid in identifying the function of the various elements of the total integrated structure. In FIG. 12, semiconductor substrate 2 forms the P-well region. Polysilicon regions 7A–F comprise doped polysilicon gates for the individual cells of the MOS memory as well as bit lines extending into the plane of the drawing. Regions 3A–C and 11 A–B are N+ source/drain regions lying between the gates 7A–F. Source regions 3A–C comprise an electrically common ground as well as forming source regions of each of the conducting semiconductor memory cells in the semiconductor memory array. Regions 11A and 11B are N+ drain regions connected to a metal bit line at locations 99A and 99B where there are holes through the insulator 16 overlying the surface of the substrate 2. The gates 7A–F are regularly but not necessarily equally spaced. For example, gate regions flanking one of the source regions 3A, 3B or 3C may be spaced further apart than a pair of gate regions flanking one of the drain regions 11A or 11B. That is, in FIG. 12, gates 7A and 7B are spaced further apart than gates 7B and 7C.

The most important feature shown in FIG. 12 is that some of the source/drain regions 3A, 3B, 3C are spaced apart from one or both of the gate regions that flank them. For example, source region 3A is spaced apart from both the edges of the overlying gate regions 7A and 7B. This is in contrast to source region 3C, which is in substantial alignment with the edges of flanking gate regions 7E and 7F. The first case (source region 3A with its overlying spaced away gate electrodes 7A and 7B) corresponds to "0" (or, if desired, "1") coded (substantially non-conducting) semiconductor memory cells while the second case (source 3C and its overlying abutting electrodes 7E and 7F) corresponds to "1" (or, if desired, "0") cells (electrically conducting type).

It will be seen that for the case of regularly spaced gate regions 7E and 7F, coding the MOS semiconductor memory array will result in source/drain regions having different lateral widths. As an example in FIG. 12, source region 3A, common to two substantially non conducting cells, is laterally narrower than source region 3C, which is common to two conducting cells. Source region 3B, common to one conducting and one non-conducting semiconductor memory cell, has an intermediate lateral width. Thus the present invention leads to an array having, for example, three different source (lateral) widths between gate pairs.

Similarly, the other preferred embodiment, i.e. masking of the drain side only, would result in regions 3A–C of the same size and regions 11A–B with no N+ junction between the edge of the common contact to the edge of the transistor being programmed. For clarity, the P+ conduction-suppression regions (22 in FIG. 11) have been omitted from FIG. 12, but it will be appreciated that such regions may be used in semiconductor substrate regions where a source or drain region is spaced apart from the edges of an overlying gate electrode or region.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A MOS read-only semiconductor memory including a plurality of semiconductor memory cells arranged in an array comprising, in combination:

a semiconductor substrate region of a first conductivity type;

a plurality of gate electrode regions overlying and insulated from a surface of said substrate;

at least one non-conducting memory cell representative of only one of a "1" and a "0" bit and comprising first source/drain means of a second conductivity type opposite said first conductivity type located in said substrate region and spaced apart from at least one edge of at least one gate electrode region of said plurality of gate electrode regions for suppressing electrical conduction in said non-conducting memory cell which includes said first source/drain means;

at least one conducting memory cell representative of only the other of said "1" and "0" bit and comprising second source/drain means of said second conductivity type located in said substrate region and spaced beneath both edges of another one of said plurality of gate electrode regions for enabling electrical conduction in said conducting memory cell which includes said second source/drain means; and at least one heavily doped region of said first conductivity type lying in a surface portion of said semiconductor substrate region between said at least one edge of said at least one gate electrode region and said first source/drain means.

2. The MOS read-only semiconductor memory according to claim 1 wherein said first and said second source/drain means are of N type conductivity.

3. A CMOS semiconductor device comprising in combination:

a semiconductor substrate;

a first MOS device having source and drain regions of one type conductivity located in said semiconductor substrate;

a second MOS device having source and drain regions of opposite type conductivity located in said semiconductor substrate;

first gate electrode means overlying and insulated from a surface of said semiconductor substrate and spaced apart from at least one edge of at least one of said source and drain regions of one of said first and said second MOS device for suppressing electrical conduction in one of said first and said second MOS device;

second gate electrode means overlying and insulated from a surface of said semiconductor substrate and overlying both edges of said source and drain regions of the other of said first and said second MOS device for enabling electrical conduction in the other one of said first and said second MOS device; and at least one heavily doped region of opposite conductivity type to said source and drain regions of said one of said first and second MOS device located in a surface region of said semiconductor substrate adjacent to said at least one edge of said at least one of said source and drain regions of said one of said first and second MOS device.

4. The CMOS semiconductor device of claim 3 wherein said first MOS device is said one of said first and said second MOS device and is an N channel MOS device located in a P type region of said semiconductor substrate, said second MOS device is said other of said other of said first and said second MOS device and is a P channel MOS device located in an N type region of said semiconductor substrate.

5. The CMOS semiconductor device of claim 3 wherein both edges of said source and drain regions of said one of said first and said second MOS device are spaced apart from corresponding edges of the overlying first gate electrode means.

6. The CMOS device of claim 5 wherein two heavily doped regions of opposite conductivity type to said source and drain regions of said one of said first and said second MOS device are located in said semiconductor substrate, one of said two heavily doped regions of opposite conductivity type being located in a surface region of said semiconductor substrate adjacent to one of said both edges of said source and drain regions of said one of said first and said second MOS device, the other of said two heavily doped regions of opposite conductivity type being located in a surface region of said semiconductor substrate adjacent the other of said both edges of said source and drain regions of said one of said first and said second MOS device.

7. The MOS device of claim 6 wherein said first MOS device is said one of said first and said second MOS device and is an N channel MOS device located in a P type region of said semiconductor substrate, said second MOS device is said other of said other of said first and said second MOS device and is a P channel MOS device located in an N type region of said semiconductor substrate.

8. The MOS read-only semiconductor memory according to claim 1 wherein said gate electrode regions are regularly spaced and comprise word lines in said semiconductor memory.

9. The MOS read-only semiconductor memory according to claim 1 further including a plurality of source regions and a plurality of drain regions, each of said drain regions being located between at least two of said source regions.

10. MOS read-only semiconductor memory according to claim 1 said plurality of gate electrode regions comprising a plurality of regularly spaced gate electrode means for activating said memory cells; and a plurality of source means of varying lateral widths each lying between a pair of said gate electrode means for coding said read-only semiconductor memory with one of a "0" or "1" designation.

11. The memory according to claim 10 wherein said source means have at least three different lateral widths.

12. The memory according to claim 10 further including a plurality of drain means each of which is located between at least two of said source means for enabling sensing of current flow in said cells.

13. The memory according to claim 10 further including heavily doped regions of said first conductivity type lying between said gate electrode means and said source means for suppressing electrical conductivity in predetermined ones of said cells.

14. The memory according to claim 12 wherein said plurality of drains means are electrically connected to a plurality of metallized bit lines.

* * * * *